(12) United States Patent
Kim et al.

(10) Patent No.: US 7,804,093 B2
(45) Date of Patent: Sep. 28, 2010

(54) THIN FILM TRANSISTOR ARRAY PANEL AND MANUFACTURING METHOD OF THE SAME

(75) Inventors: Jang-Soo Kim, Yongin-si (KR); Sang-Soo Kim, Seoul (KR); Shi-Yul Kim, Yongin-si (KR); Jang-Sub Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/335,928

(22) Filed: Dec. 16, 2008

(65) Prior Publication Data

US 2010/0001276 A1    Jan. 7, 2010

(30) Foreign Application Priority Data

Jul. 7, 2008    (KR) ...................... 10-2008-0065548

(51) Int. Cl.
  *H01L 29/04* (2006.01)
  *H01L 31/036* (2006.01)
  *H01L 31/0376* (2006.01)
  *H01L 31/20* (2006.01)

(52) U.S. Cl. .......................................... 257/59; 257/72

(58) Field of Classification Search .................. 257/59, 257/72
  See application file for complete search history.

(56) References Cited

U.S. PATENT DOCUMENTS

| | | | |
|---|---|---|---|
| 7,292,294 B2 | 11/2007 | Hung et al. | |
| 7,352,004 B2 * | 4/2008 | Lee et al. | 257/59 |
| 7,580,102 B2 * | 8/2009 | Song | 349/139 |
| 2005/0117093 A1 | 6/2005 | Kim et al. | |
| 2006/0050192 A1 * | 3/2006 | Cho et al. | 349/42 |
| 2006/0091396 A1 * | 5/2006 | Lee et al. | 257/72 |

FOREIGN PATENT DOCUMENTS

| | | |
|---|---|---|
| JP | 08146402 | 6/1996 |
| JP | 2001021878 | 1/2001 |
| JP | 2002258262 | 9/2002 |
| JP | 2005284291 | 10/2005 |
| JP | 2006293385 | 10/2006 |
| KR | 1020040005652 A | 1/2004 |
| KR | 1020050014060 A | 2/2005 |
| KR | 1020050040258 A | 5/2005 |
| KR | 1020070005218 A | 1/2007 |
| KR | 1020070009761 A | 1/2007 |
| KR | 1020070082090 A | 8/2007 |

* cited by examiner

*Primary Examiner*—Thien F Tran
(74) *Attorney, Agent, or Firm*—Cantor Colburn LLP

(57) ABSTRACT

A thin film transistor array panel includes an insulating substrate, a gate line and a data line disposed on the insulating substrate and insulated from and intersecting each other, a thin film transistor connected to the gate line and the data line, a partition disposed corresponding to the gate line and the data line and defining a color filter filling region, a color filter disposed in the filling region, a passivation layer disposed on the color filter and the partition, and a pixel electrode disposed on the passivation layer and connected to the thin film transistor through a contact hole disposed through the passivation layer and the color filter. A plane shape of the color filter filling region is substantially a rectangle.

8 Claims, 16 Drawing Sheets

THIN FILM TRANSISTOR ARRAY PANEL AND MANUFACTURING METHOD OF THE SAME

This application claims priority to Korean Patent Application No. 10-2008-0065548 filed on Jul. 7, 2008, and all the benefits accruing therefrom under 35 U.S.C. §119, the entire contents of which are incorporated herein by reference.

BACKGROUND OF THE INVENTION (a) Field of the Invention

The present invention relates to a thin film transistor array panel and a manufacturing method thereof.

(b) Description of the Related Art

A liquid crystal display ("LCD") is one of the most widely used flat panel displays ("FPD"), and it is composed of two display panels on which field generating electrodes are formed, and a liquid crystal layer interposed between the two display panels. A voltage is applied to the field generating electrodes to generate an electric field on the liquid crystal layer, and the orientation of liquid crystal molecules of the liquid crystal layer is determined and the polarization of incident light is controlled through the generated electric field to display an image.

Among the different types of LCDs, an LCD having a structure in which field generating electrodes are respectively formed on two display panels is widely used. Among the two display panels, a plurality of pixel electrodes and thin film transistors are arranged in a matrix on one display panel (hereinafter referred to as a "thin film transistor array panel") and color filters of red, green, and blue are formed thereon, and a common electrode covers the entire surface of the other display panel (hereinafter referred to as a "common electrode panel").

BRIEF SUMMARY OF THE INVENTION

As a liquid crystal display may include the pixel electrodes and the color filters disposed on different display panels, there are technical difficulties in manufacturing the liquid crystal display. For example, it is difficult to align the pixel electrodes and the color filters with each other, thereby generating an alignment error. To address this problem, a color filter on array ("CoA") structure, in which the pixel electrode and the color filter are formed on the same display panel, may be employed.

In a manufacturing method of forming the pixel electrode and the color filter on the same display panel, when forming the color filter along with the thin film transistor, the color filter may be formed by an inkjet printing method. In the ink jet method, liquid ink is sprayed (e.g., jetted) to predetermined divided portions to implement each ink-colored image, and a plurality of colors including red, green, and blue can be advantageously formed at one time such that the manufacturing process, time, and cost can be considerably reduced.

The liquid ink may be used in the inkjet printing such that partitions to enclose the ink are required. The partitions prevent light leakage and have a function to enclose each color filter such that the partitions may have various shapes according to the shape of the pixel electrode and a position of a contact hole. However, if the partitions have various shapes, various mask patterns to form the various partitions are additionally required, and may increase the manufacturing process, time, and cost. Also, when filling the color filters in the partitions, a portion where the color filters are not sufficiently filled according to a complicated shape of the partitions may be generated, and the color filters may overflow to a neighboring pixel.

An exemplary embodiment of the present invention provides a thin film transistor array panel and a manufacturing method thereof including a partition and a pixel electrode having various patterns.

An exemplary embodiment of a thin film transistor array panel according includes an insulating substrate, a gate line and a data line disposed on the insulating substrate and insulated from and intersecting each other, a thin film transistor connected to the gate line and the data line, a partition disposed corresponding to the gate line and the data line and defining a color filter filling region, a color filter disposed in the filling region, a passivation layer disposed on the color filter and the partition, and a pixel electrode disposed on the passivation layer and connected to the thin film transistor through a contact hole disposed in the passivation layer and the color filter. A plane shape of the color filter filling region is substantially a rectangle.

The boundaries of the passivation layer and the color filter adjacent to the contact hole may be disposed substantially coplanarly with each other.

The contact hole may be disposed at a position in the filling region.

The thickness of the partition and the color filter may be more than 0.3 micrometer (μm), where the thickness is taken substantially perpendicular to the insulating substrate.

The partition may include a black pigment, and the passivation layer may include a photosensitive organic material.

The partition may include an expansion portion disposed in the filling region, and the contact hole may be disposed coinciding with the expansion portion.

The boundaries of the passivation layer and the expansion portion defining the contact hole may be disposed substantially coplanarly.

An exemplary embodiment of a manufacturing method of a thin film transistor array panel includes forming a gate line including a gate electrode on a substrate, forming a gate insulating layer on the gate line, forming a semiconductor and an ohmic contact layer on the gate insulating layer, forming a data line including a source electrode and a drain electrode on the ohmic contact layer, forming a lower passivation layer on the data line and the drain electrode, forming a partition with a quadrangle shape in a plan view on the lower passivation layer and corresponding to the gate line and the data line, forming a color filter in a filling region defined by the partition, forming an upper passivation layer on the color filter, simultaneously etching the upper passivation layer and the color filter to form a contact hole exposing the drain electrode, and forming a pixel electrode connected to the drain electrode through the contact hole on the upper passivation layer.

An exemplary embodiment of a manufacturing method of a thin film transistor array panel according to the present invention includes forming a gate line including a gate electrode on a substrate, forming a gate insulating layer on the gate line, forming a semiconductor and an ohmic contact layer on the gate insulating layer, forming a data line including a source electrode and a drain electrode on the ohmic contact layer, forming a lower passivation layer on the data line and the drain electrode, forming a partition including a straight portion corresponding to the gate line and data line, and an expansion portion overlapping at least a portion of the drain electrode on the lower passivation layer, forming a color filter in the filling region defined by the partition, forming an upper passivation layer on the color filter, simultaneously etching the upper passivation layer and the color filter to form a contact hole exposing the drain electrode, and forming a pixel electrode connected to the drain electrode through the contact hole on the upper passivation layer.

In an exemplary embodiment, the partition does not include a curved portion or a protrusion, such that the shape of the partition is not changed even though a contact hole is disposed in varying positions of a pixel, and the same mask for the partition may be used for various patterns of the pixel electrode.

In an exemplary embodiment, a portion of the thin film transistor array panel where the contact hole will be located, is not opened prior to the forming the partition contact hole, such that an overall area of the partition may be minimized, thereby increasing the aperture ratio.

DETAILED DESCRIPTION OF THE INVENTION

Figure 1:
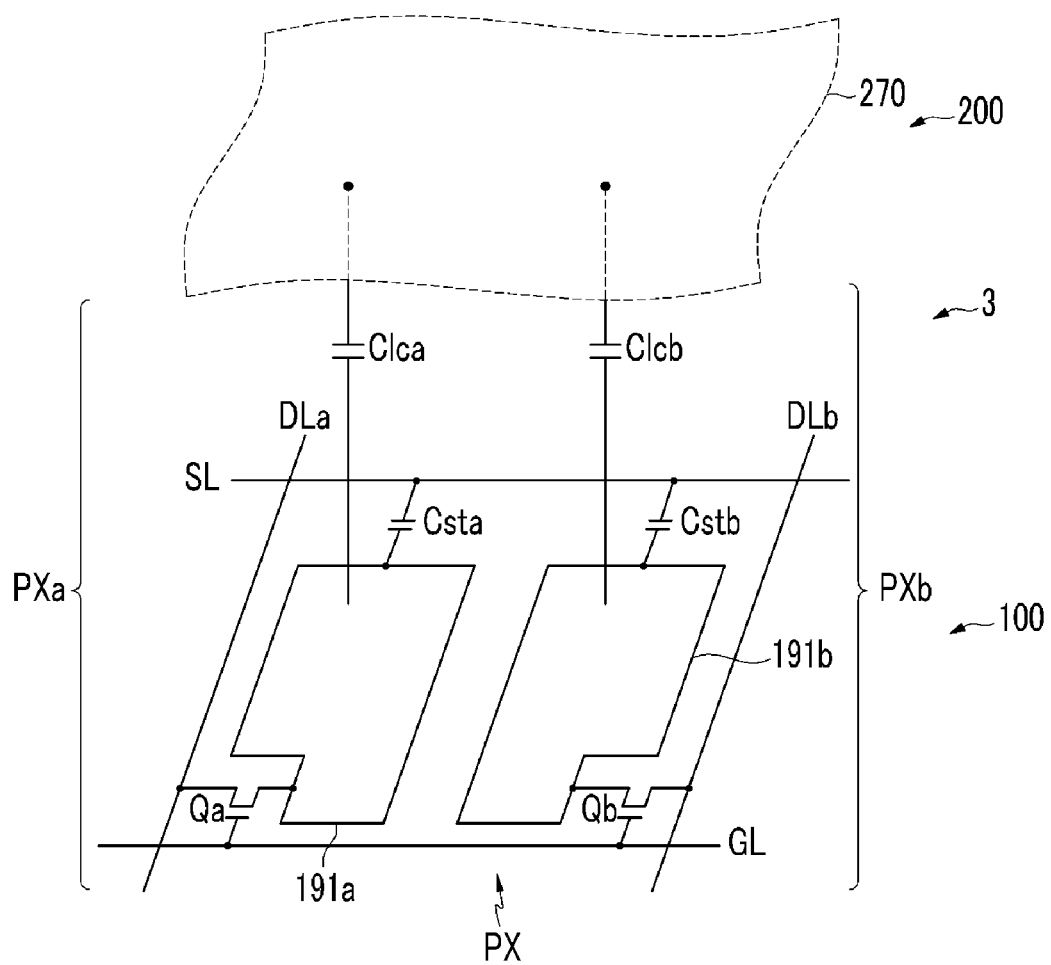
FIG. 1 is an equivalent circuit diagram of an exemplary embodiment of one pixel in a liquid crystal display, according to the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "upper" or "over" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

FIG. 1 is an equivalent circuit diagram of an exemplary embodiment of one pixel in a liquid crystal display, according to the present invention.

Referring to FIG. 1, a liquid crystal display includes signal lines including a plurality of a gate line GL, a plurality of a pairs of data lines DLa and DLb, a plurality of a storage electrode line SL, and a plurality of a pixel PX connected to the signal lines, respectively. The liquid crystal display includes a lower panel 100 and an upper panel 200 facing each other, and a liquid crystal layer 3 interposed between the lower and upper panels 100 and 200.

Each pixel PX includes a pair of subpixels PXa and PXb. Each subpixel PXa/PXb respectively includes a switching element Qa/Qb, a liquid crystal capacitor Clca/Clcb, and a storage capacitor Csta/Cstb.

Each switching element Qa/Qb may be a three-terminal element, such as a thin film transistor, disposed on the lower panel 100. The thin film transistor may include a control terminal connected to the gate line GL, an input terminal connected to the data line DLa/DLb, and an output terminal connected to the liquid crystal capacitor Clca/Clcb and the storage capacitor Csta/Cstb.

In the illustrated embodiment, the liquid crystal capacitor Clca/Clcb uses a subpixel electrode 191a/191b and a common electrode 270 as two terminals. The liquid crystal layer 3 disposed between subpixel electrodes 191a/191b and the common electrode 270, functions as a dielectric material.

In an exemplary embodiment, the storage electrode line SL is disposed on the lower display panel 100, and a subpixel electrode 191a/191b overlaps with an insulator interposed between the storage electrode line SL and the subpixel electrode 191a/191b. A predetermined voltage, such as the common voltage Vcom, is applied to the storage capacitor Csta/Cstb, which functions as an assistant to the liquid crystal capacitor Clca/Clcb.

A predetermined difference in voltage is generated between voltages charged to two liquid crystal capacitors Clca and Clcb. In one exemplary embodiment, the data voltage applied to the liquid crystal capacitor Clca is less or more than the data voltage applied to the liquid crystal capacitor Clcb. When the voltages of the first and second liquid crystal capacitors Clca and Clcb are appropriately adjusted, it is possible to make images viewed from a side of the liquid crystal display be as similar as possible to the images viewed from a front of the liquid crystal display. Advantageously, it is possible to improve a side visibility of images displayed by the liquid crystal display.

Next, an exemplary embodiment of a liquid crystal display according to the present invention will be described in detail with reference to FIG. 2 to FIG. 5.

Figure 2:
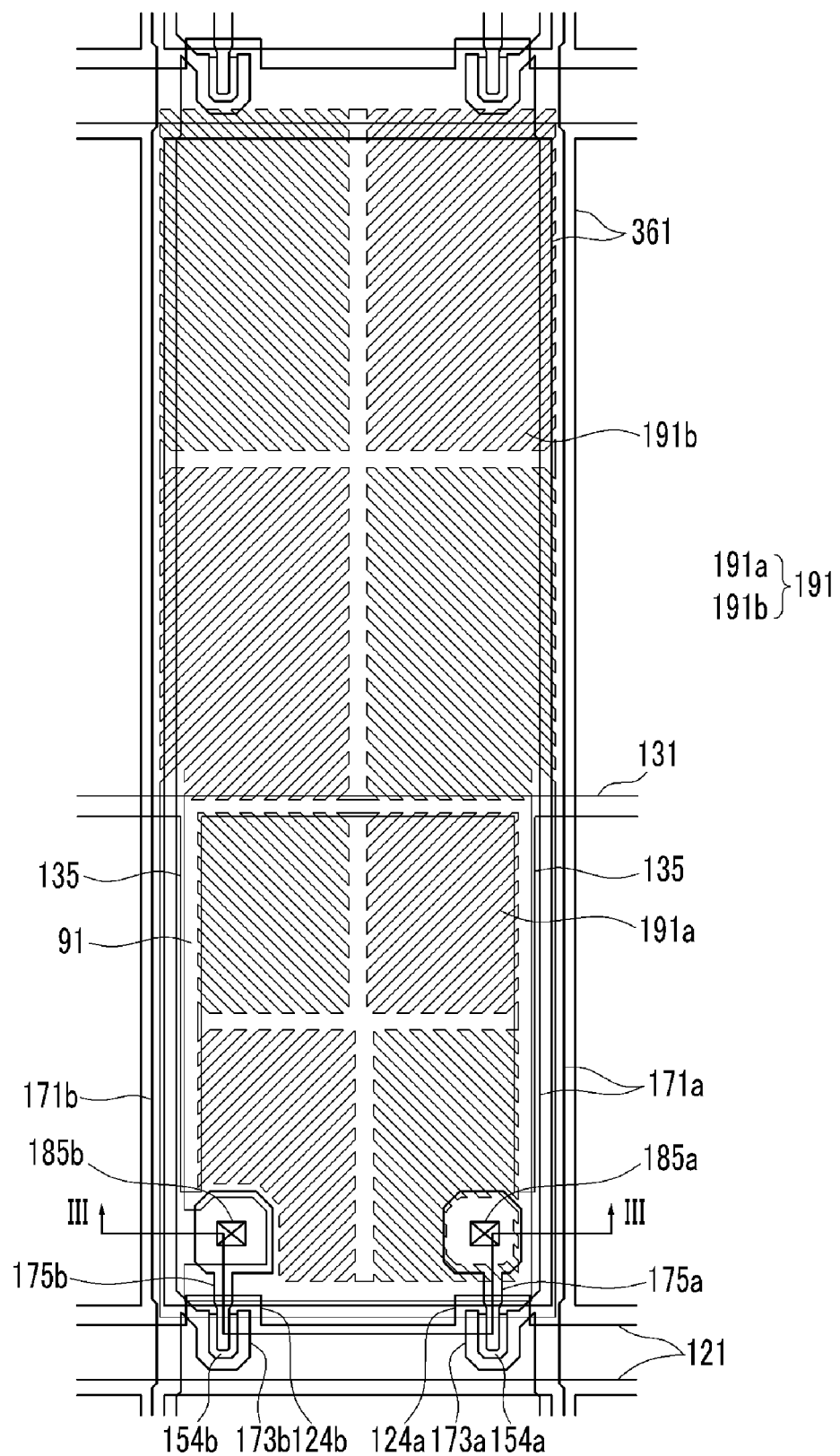
FIG. 2 is a layout view of an exemplary embodiment of a liquid crystal display according to the present invention.
Figure 3:
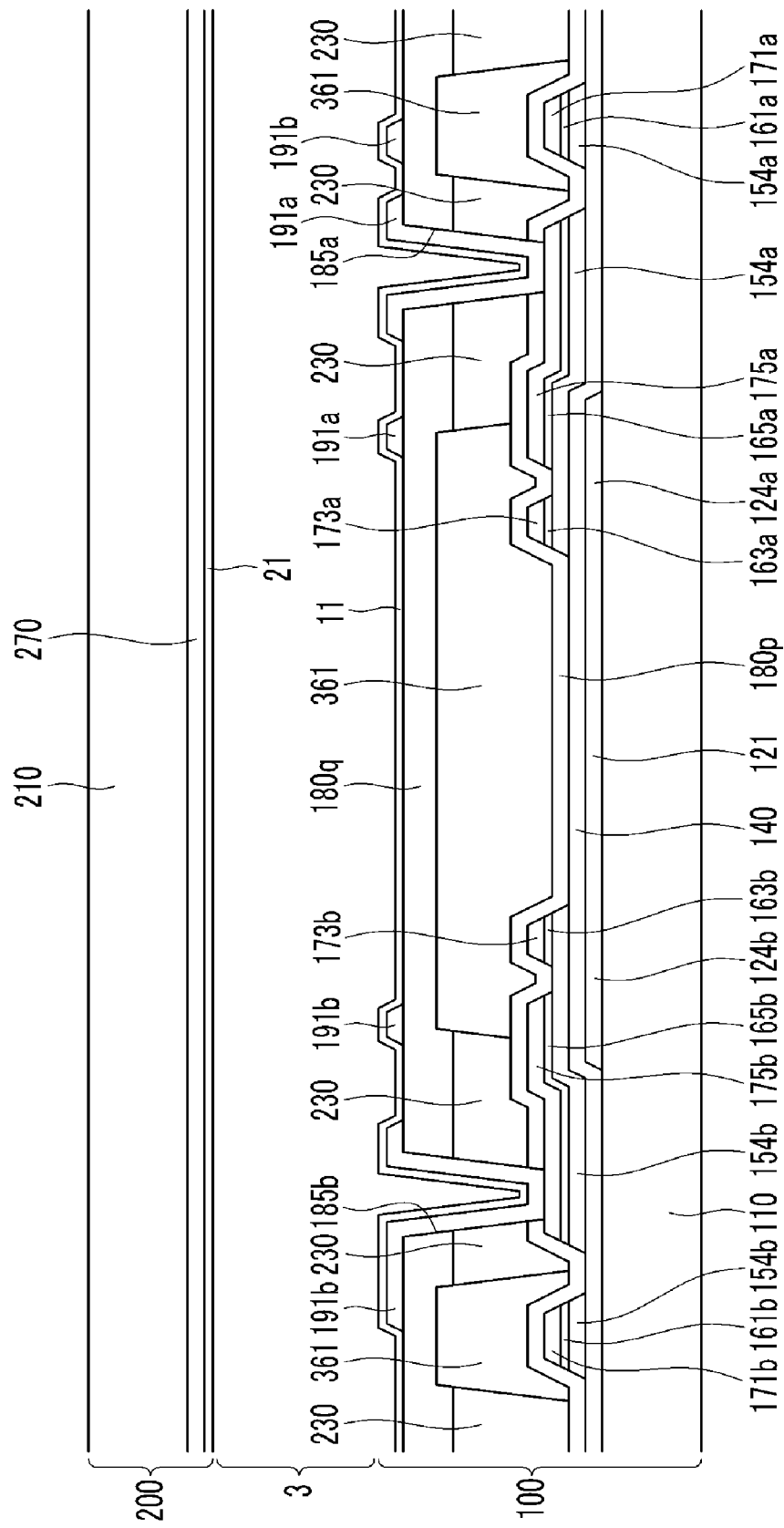
FIG. 3 is a cross-sectional view of the liquid crystal display shown in FIG. 2 taken along line III-III.
Figure 4:
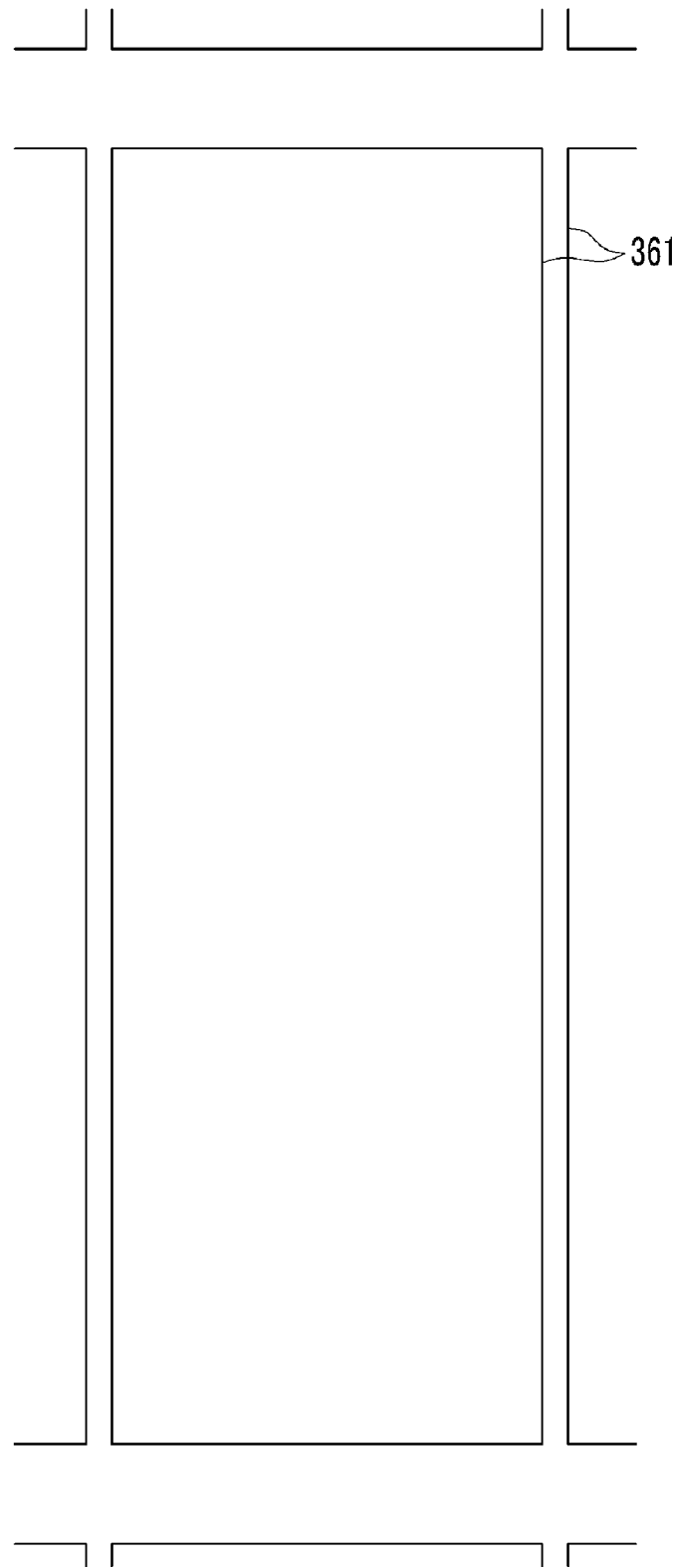
FIG. 4 is a top plan view showing an exemplary embodiment of a partition of the liquid crystal display shown in FIG. 2.
Figure 5:
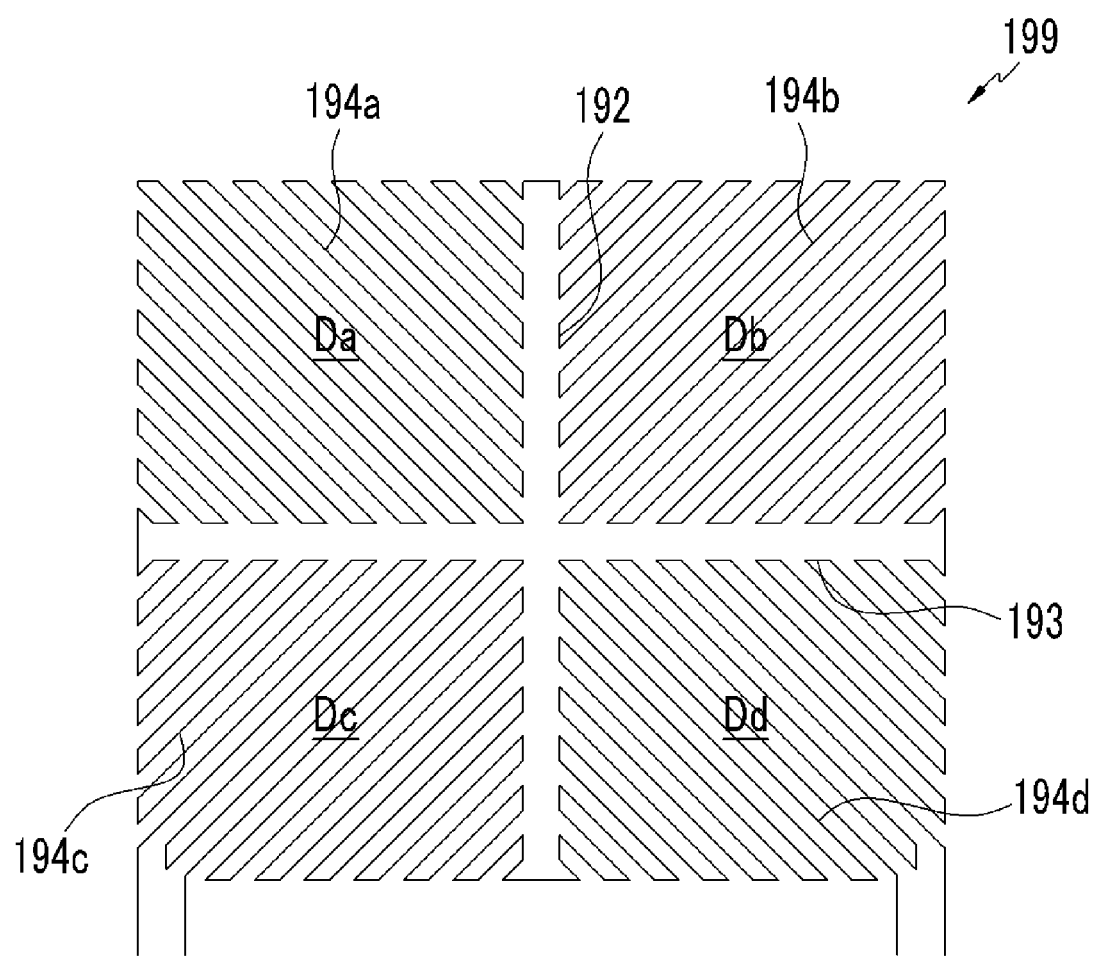
FIG. 5 is a top plan view of an exemplary embodiment a basic electrode for a pixel electrode, according to the present invention.

FIG. 2 is a layout view of an exemplary embodiment of a liquid crystal display according to the present invention, FIG. 3 is a cross-sectional view of the liquid crystal display shown in FIG. 2 taken along line III-III, FIG. 4 is a top plan view showing an exemplary embodiment of a partition of the liquid crystal display shown in FIG. 2, and FIG. 5 is a top plan view of an exemplary embodiment of a basic electrode for a pixel electrode, according to the present invention.

Referring to FIGS. 2 and 3, a liquid crystal display includes a lower display panel 100 and an upper display panel 200 facing to each other, and the liquid crystal layer 3 interposed between the two display panels 100 and 200.

[Referring to FIG. 2, it appears that line III-III crosses through subpixel 191b at the right side end of Line III-III, after crossing subpixel 191a. However, FIG. 3 as a cross section along line III-III, does not show the subpixel 191b at tie right of the drawing. Please advise if subpixel 191b should be shown in FIG. 3]

Firstly, the lower panel 100 will be described.

A plurality of a gate line 121 and a plurality of s storage electrode line 131 and 135 are disposed on an insulating substrate 110.

The gate lines 121 transmit gate signals, and substantially extend in a transverse direction. Each gate line 121 includes a plurality of first and second gate electrodes 124a and 124b protruding upward in a longitudinal direction in the layout view of FIG. 2, from a main portion of the gate line 121. The longitudinal direction is substantially perpendicular to the transverse direction, in the layout view.

The storage electrode lines 131 include a stem extending substantially parallel to the gate lines 121, and a plurality of storage electrodes 135 extended from the stem. The storage electrodes 135 extend downward from the stem of the storage electrode line 131 in a direction toward the first and second gate electrodes 124a and 124b.

In alternative embodiments, shapes and arrangement of the storage electrode lines 131 and/or 135 may be modified in various forms.

A gate insulating layer 140 is disposed on the gate lines 121 and the storage electrode lines 131 and 135. A plurality of a first semiconductor 154a and a second semiconductor 154b are disposed on the gate insulating layer 140. In exemplary embodiments, the semiconductors 154a and 154b preferably include amorphous or crystallized silicon.

A pair of a plurality of ohmic contacts 161a, 161b, 163a, 163b, 165a, and 165b are disposed on the first and second semiconductors 154a and 154b. In exemplary embodiments, the ohmic contacts 161a, 161b, 163a, 163b, 165a, and 165b may include a material, such as n+ hydrogenated amorphous silicon, in which an n-type impurity is doped with a high concentration, or of silicide.

A plurality of a pair of data lines 171a and 171b, and a plurality of a first drain electrode 175a and a second drain electrode 175b are disposed on the ohmic contacts 161a, 161b, 163a, 163b, 165a, and 165b, and on the gate insulating layer 140.

The first and second data lines 171a and 171b transmit data signals, extend substantially in the longitudinal direction, and cross (e.g., overlap) the gate lines 121 and the stem of the storage electrode lines 131. Each of the first/second data line 171a/171b includes a plurality of first/second source electrodes 173a/173b extending toward the first/second gate electrodes 124a/124b and curved with a "U" shape in the layout view. The first/second source electrodes 173a/173b is disposed opposite to the first/second drain electrodes 175a/175b, with respect to the first/second gate electrodes 124a/124b.

Each of the first and second drain electrodes 175a and 175b includes a first (distal) end essentially enclosed by the "U" shape first and second source electrodes 173a and 173b, respectively, in a layout view. From the first distal end, the first and second drain electrodes 175a and 175b extends upward (e.g., in the longitudinal direction) to a second end opposite to the first end. The second end of the first and second drain electrodes 175a and 175b, may have a relatively wide area, taken in the transverse and/or longitudinal direction, for connection with another layer in the liquid crystal display.

In alternative embodiments, shapes and arrangement of the first and second drain electrodes 175a and 175b, and of the first and second data lines 171a and 171b, may be modified in various forms.

A first/second gate electrode 124a/124b, a first/second source electrode 173a/173b, a first/second drain electrode 175a/175b, and a first/second semiconductor 154a/154b, respectively form a first/second thin film transistor ("TFT") Qa/Qb. A channel of the first/second thin film transistor Qa/Qb is disposed on the first/second semiconductor 154a/154b, and defined by an between the first/second source electrode 173a/173b and the first/second drain electrode 175a/175b, respectively.

The ohmic contacts 163b and 165b are interposed only between the underlying semiconductor islands 154a and 154b, and the overlying data lines 171a and 171b and drain electrodes 175a and 175b. The ohmic contacts 163b and 165b reduce contact resistance between the underlying semiconductor islands 154a and 154b, and the overlying data lines 171a and 171b and drain electrodes 175a and 175b.

The semiconductors 154a and 154b include a portion exposed, e.g., not overlapped by the data lines 171a and 171b and the drain electrodes 175a and 175b, and a portion between the source electrodes 173a and 173b and the drain electrodes 175a and 175b.

In the illustrated embodiment, the ohmic contacts 161a, 161b, 163a, 163b, 165a, and 165b, and the data lines 171a, 171b, 173a, and 173b and the drain electrodes 175a and 175b have substantially the same plane shape as each other. The ohmic contacts 161a, 161b, 163a, 163b, 165a, and 165b, and the data lines 171a, 171b, 173a, and 173b and the drain electrodes 175a and 175b also have substantially a same plane shape as the semiconductors 154a and 154b, except for an exposed portion between the drain electrodes 175a and 175b, and the source electrodes 173a and 173b.

Referring to FIG. 3, a lower passivation layer 180p is disposed on the data lines 171a and 171b, the drain electrodes 175a and 175b, and the exposed portions of the semiconductors 154a and 154b. The lower passivation layer 180p directly contacts the exposed portions of the semiconductors 154a and 154b. The lower passivation layer 180p may also directly contact an exposed portion of the gate insulating layer 140 disposed between the first and second source electrodes 173a and 173b. In an exemplary embodiment, the lower passivation layer 180p may preferably include silicon nitride or silicon oxide.

A partition 361 is disposed directly on the lower passivation layer 180p. In an exemplary embodiment, the partition 361 may include a light blocking insulating material absorbing light and being black. The partition 361 may function as and be referred to as a light blocking member. Alternatively, a separate member from the partition, may be disposed on the lower and/or upper panels 100 and 200 as the light blocking member. The partition 361 defines boundaries of a pixel. Referring to FIG. 4, the partition 361 is disposed corresponding to the gate lines 121 and the data lines 171a and 171b. As used herein, "corresponding" means being substantially similar in dimension, relative positional placement and/or shape. The partition 361 includes first portions having a first extension direction substantially parallel to the transverse direction, and second portions having a second extension direction substantially parallel to the longitudinal direction. A width of the first portions, taken perpendicular to the first extension direction, is larger than a width of the second portions, taken perpendicular to the second extension direction. In the layout and plan views of FIGS. 2 and 4, a region enclosed by the partition 361, e.g., where the partition 361 forms a continuous boundary of the region, is shaped substantially as a rectangle. The enclosed region functions as a filling region where a color filter 230 is filled during manufacturing. In a manufacturing process, the color filter 230 may be formed in the pixel defined by the partition 361, and the partition 361 is considered as not overlapping with or disposed on the pixel.

Again referring to FIGS. 2 and 3, the color filter 230 is disposed in the filling region surrounded on all sides (in the layout and plan views) by a continuous portions of the partition 361.

The lower passivation layer 180p reduced or effectively prevents the pigment of the color filter 230 from flowing to the exposed semiconductors 154a and 154b.

An upper passivation layer 180q is disposed on the partition 361 and the color filter 230. In an exemplary embodiment, the upper passivation layer 180q may include an organic material having photosensitivity. Also, the upper passivation layer 180q preferably has a thickness, taken in a direction substantially perpendicular to the insulating substrate 110, of more than 1.0 micrometer ($\mu$m) to reduce a coupling effect between the pixel electrode 191 and the data lines 171a and 171b, and to substantially planarize an upper surface of the lower panel 100.

The upper passivation layer 180q, the color filter 230, and the lower passivation layer 180p include a plurality of contact holes 185a and 185b extending completely through the upper passivation layer 180q, the color filter 230, and the lower passivation layer 180p, and exposing the first and second drain electrodes 175a and 175b, respectively. In an exemplary embodiment of a method of manufacturing, the contact holes 185a and 185b may be simultaneously formed in the upper passivation layer 180q, the color filter 230, and the lower passivation layer 180p, such that boundaries defining the contact holes 185a and 185b in the upper passivation layer 180q, the color filter 230, and the lower passivation layer 180p, have substantially the same plane shape.

In an exemplary embodiment of the present invention, as shown in FIG. 4, the partition 361 is only disposed corresponding to the gate lines 121 and the data lines 171a and 171b, such that the partition 361 substantially forms a quadrangle, and is not presented in the pixel. Advantageously, the area occupied by the partition 361 is minimized, and the aperture ratio of the liquid crystal display is increased. A plurality of the pixel electrode 191 are disposed on and directly contacting the upper passivation layer 180q.

Each pixel electrode 191 includes the first and second subpixel electrodes 191a and 191b separated from each other by a gap 91 (FIGS. 2 and 6), having a quadrangular belt shape. In exemplary embodiments, the first and second subpixel electrodes 191a and 191b respectively include a basic electrode 199, such as shown in FIG. 5, or at least one modification thereof.

Next, the basic electrode 199 will be described in detail with reference to FIG. 5.

As shown in FIG. 5, the overall shape of the basic electrode 199 is a quadrangle in a plan view. The basic electrode 199 includes a cross-shaped stem, including a transverse stem 193 and a longitudinal stem 192 disposed substantially perpendicular to each other. The basic electrode 199 is divided into a first sub-region Da, a second sub-region Db, a third sub-region Dc, and a fourth sub-region Dd by the transverse stem 193 and the longitudinal stem 192. Each of the sub-regions Da-Dd include a plurality of first to fourth minute branches 194a, 194b, 194c, and 194d.

The first minute branch 194a obliquely extends from the transverse stem 193 or the longitudinal stem 192 toward an upper-left direction, and the second minute branch 194b obliquely extends from the transverse stem 193 or the longitudinal stem 192 in an upper-right direction. Also, the third minute branch 194c obliquely extends from the transverse stem 193 or the longitudinal stem 192 in a lower-left direction, and the fourth minute branch 194d obliquely extends from the transverse stem 193 or the longitudinal stem 192 in a lower-right direction. The first to fourth minute branches 194a-194d are extended in first to fourth extension directions, respectively.

The first to fourth minute branches 194a-194d form an angle of about 45 degrees or 135 degrees with the gate lines 121 or the transverse stem 193. The minute branches 194a-194d of two neighboring sub-regions Da-Dd may disposed substantially perpendicular to each other.

A width of the fourth minute branches 194a-194d taken in a direction perpendicular to the respective extension direction, may be substantially the same from a first end adjacent to the transverse stem 193 or the longitudinal stem 192, to a second (distal) end at a periphery of the basic electrode 199. Alternatively, the width of the minute branches 194a-194d may become wider at the first end and closer to the transverse stem 193 or the longitudinal stem 192.

Again referring to FIG. 2 to FIG. 5, each of the first and second subpixel electrodes 191a and 191b may include one basic electrode 199. Each pixel electrode 191 includes the first and second subpixel electrodes 191a and 191b. An area occupied by the second subpixel electrode 191b may be larger than an area occupied by the first subpixel electrode 191a in the pixel electrode 191. In one exemplary embodiment, the basic electrodes 199 of the first and second subpixel electrodes 191a and 191b, may be formed differently from each other, such that the area of the second subpixel electrode 191b being approximately 1.0 to 2.2 times the area of the first subpixel electrode 191a.

Each first/second subpixel electrode 191a/191b is physically and electrically connected to the first/second drain electrode 175a/175b through the contact hole 185a/185b, respectively, and receive data voltages from the first/second drain electrode 175a/175b.

Figure 6:
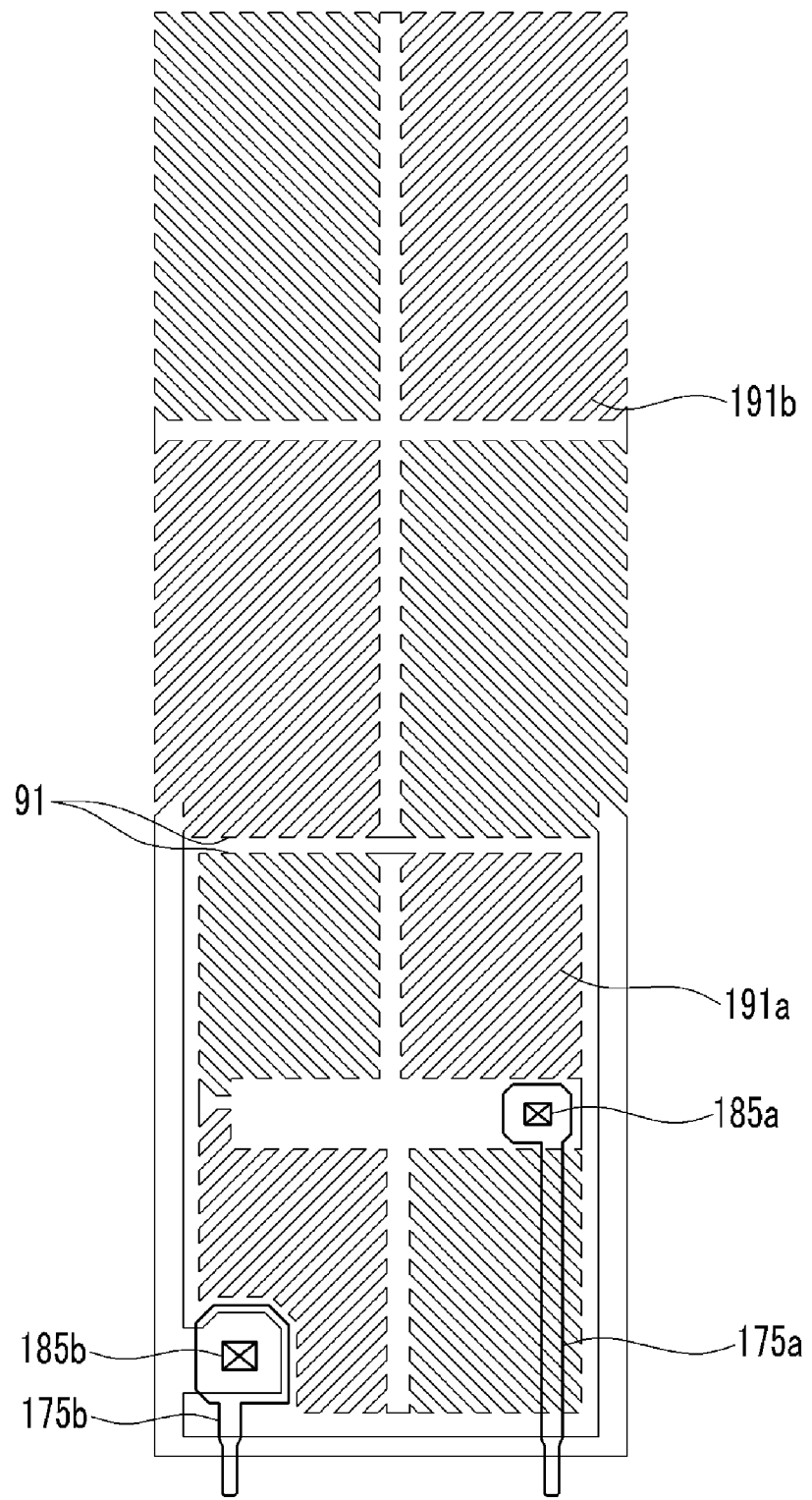
FIGS. 6 and 7 are layout views showing exemplary embodiments of a pixel electrode, a drain electrode and a contact hole, according to the present invention.
Figure 7:
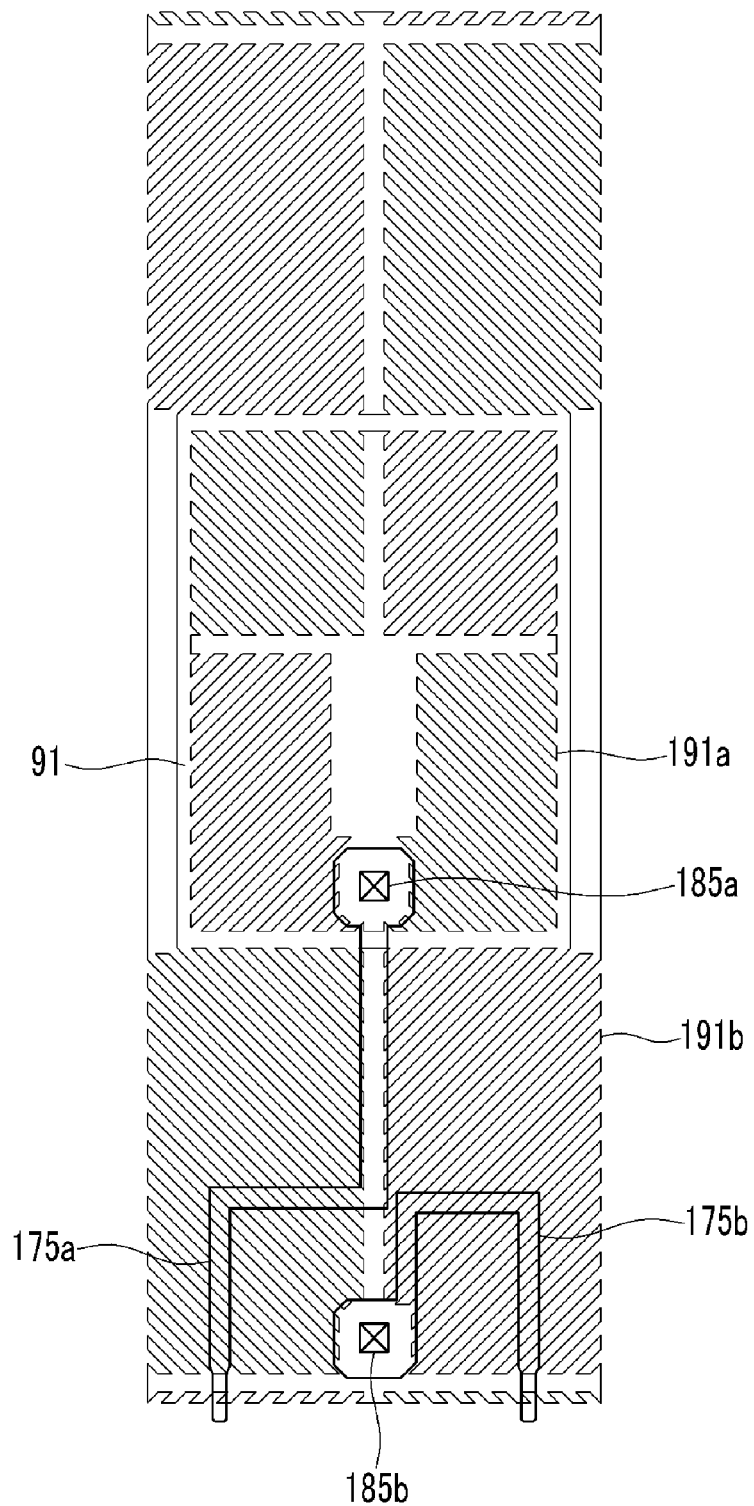

A plane pattern of the pixel electrode 191 may be formed with various patterns, as shown in FIGS. 6 and 7 by varying the basic (e.g, reference) electrode 199.

FIGS. 6 and 7 are layout views showing exemplary embodiments of a pixel electrode, a drain electrode, and a contact hole, according to the present invention.

Referring to FIGS. 6 and 7, the shape of the drain electrodes 175a and 175b is changed according to the plane pattern of the reference electrode 199, such that the positions of the contact holes 185a and 185b for connecting the pixel electrodes 191a and 191b are also changed.

However, when the partition 361 is formed with the quadrangle shape as in the illustrated exemplary embodiment of the present invention, and the partition 361 is not presented in the pixel, manufacturing processes or a structure of the liquid crystal display are not negatively effected, even though the positions of the contact holes 185a and 185b are changed.

An alignment layer 11 is disposed on and directly contacting the pixel electrode 191.

Next, the upper panel 200 will be described.

Referring again to FIG. 3, the common electrode 270 is disposed on an insulating substrate 210, and an alignment layer 21 is disposed thereon. The alignment layer 21 may be disposed directly on the common electrode 270 and/or overlapping an entire surface of the common electrode. In exemplary embodiments, each of the alignment layers 11 and 21 may be a vertical alignment layer.

Polarizers (not shown) may be disposed on one or more of outer surface of the display panels 100 and 200.

The liquid crystal layer 3 interposed between the lower panel 100 and the upper panel 200 includes liquid crystal molecules (not shown) having negative dielectric anisotropy.

If the gate lines 121 are applied with the gate signals, the data voltage is applied to the first and second subpixel electrodes 191a and 191b through the data lines 171a and 171b, respectively. The first and second subpixel electrodes 191a and 191b applied with the data voltage, and the common electrode 270 applied with the common voltage, together generate an electric field to the liquid crystal layer 3. Edges of the minute branches 194a-194d (FIG. 5) distort the electric field to make horizontal components perpendicular to the edges of the minute branches 194a-194d. An inclination direction of the liquid crystal molecules is aligned in the direction determined by the horizontal components. The liquid crystal molecules firstly tend to tilt in the direction perpendicular to the edges of the minute branches 194a-194d. However, the directions of the horizontal components of the electric field by the neighboring minute branches 194a-194d are opposite to each other, and the intervals between the minute branches 194a-194d are relatively narrow such that the liquid crystal molecules, tending to arrange in the opposite directions, are tilted in the direction parallel to the extension (e.g., length) direction of the minute branches 194a-194d.

In an exemplary embodiment of the present invention, the length directions in which the minute branches 194a-194d are extended in one pixel PX includes four directions, such that the inclined directions of the liquid crystal molecules are all the four directions. Advantageously, a viewing angle of the liquid crystal display is widened by varying the inclined directions of the liquid crystal molecules.

In an exemplary embodiment, the first subpixel electrode 191a and the second subpixel electrode 191b are applied with different data voltages through the different data lines 171a and 171b. The voltage of the first subpixel electrode 191a, having the relatively smaller area, is higher than the voltage of the second subpixel electrode 191b, having the relatively larger area.

In this way, if the voltages of the first sub-pixel electrode 191a and the second sub-pixel electrode 191b are different from each other, the voltage applied to the first liquid crystal capacitor Clca formed between the first sub-pixel electrode 191a and the common electrode 270, and the voltage applied to the second liquid crystal capacitor Clcb formed between the second sub-pixel electrode 191b and the common electrode 270 are different from each other, such that the declination angle of the liquid crystal molecules of the subpixels PXa and PXb are different from each other. As the voltages of the first and second liquid crystal capacitors Clca and Clcb are appropriately controlled, the images visible at a side of the liquid crystal display may be approximately or substantially the same to the images shown at a front of the liquid crystal display, thereby improving the side visibility.

An exemplary embodiment of a manufacturing method of a thin film transistor array panel for the above-described liquid crystal display will now be described with reference to FIGS. 8 to 11.

FIGS. 8 to 11 are cross-sectional views sequentially showing an exemplary embodiment of a manufacturing method of a thin film transistor array panel for the liquid crystal display shown in FIGS. 2 and 3.

Figure 8:
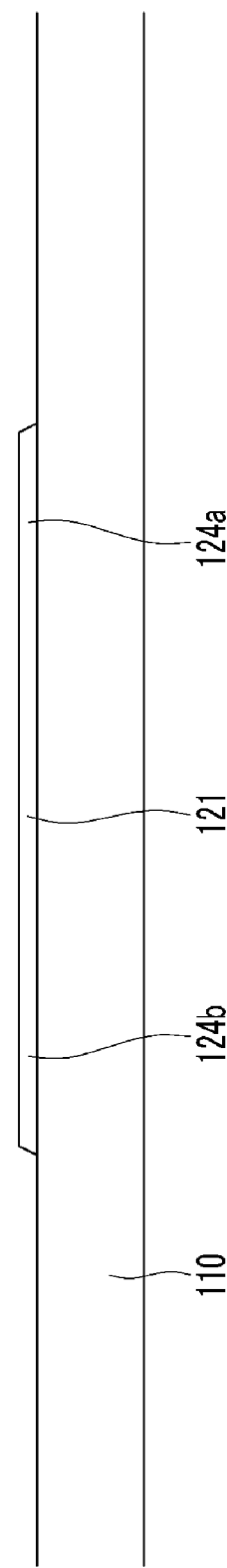
FIGS. 8 to 11 are cross-sectional views sequentially showing an exemplary embodiment of a manufacturing method of a thin film transistor array panel for the liquid crystal display shown in FIGS. 2 and 3.

As shown in FIG. 8, a gate line 121 including gate electrodes 124a and 124b, is formed on an insulation substrate 110.

Figure 9:
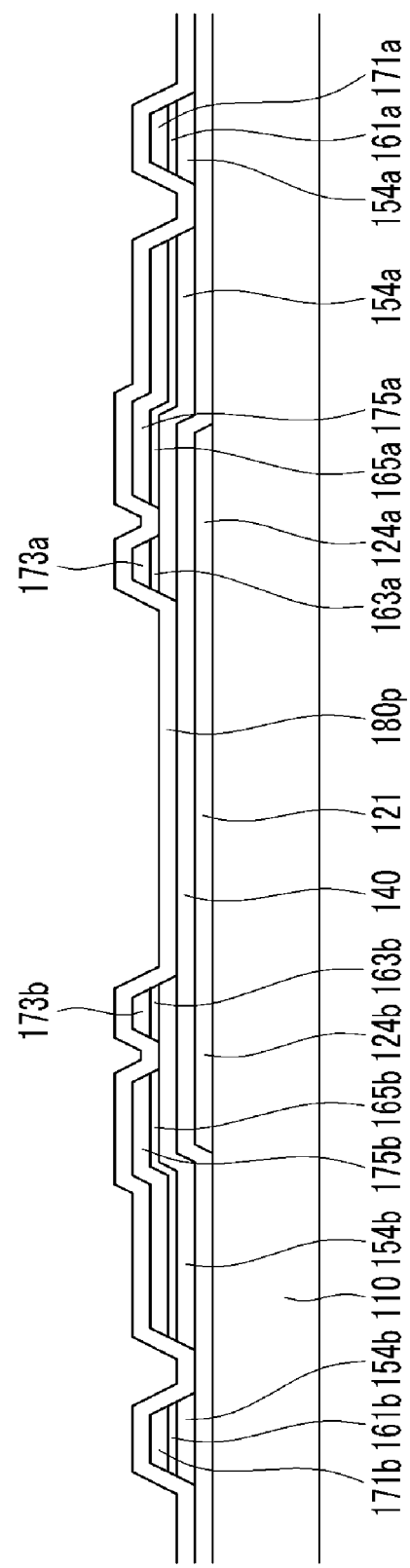

As shown in FIG. 9, a gate insulating layer 140, an amorphous silicon layer that is doped with an impurity, an amorphous silicon layer doped with an impurity, and a data conductive layer are sequentially deposited on the substrate 110 including the gate line 121.

A photosensitive film (not shown) is coated on the data conductive layer, and is exposed and developed, such as by using a slit mask, to form a photoresist pattern having different thickness depending on a position. The data conductive layer, the doped amorphous silicon layer, and the non-doped amorphous silicon layer are firstly etched by using the photoresist pattern as a mask to form semiconductors 154a and 154b, and the data conductive layer is secondly etched to form data lines 171a and 171b including source electrodes 173a and 173b and drain electrodes 175a and 175b.

The exposed amorphous silicon layer is etched by using the source electrodes 173a and 173b and the drain electrode 175a and 175b as an etch mask, to form ohmic contact layers 161a, 161b, 163a, 163b, 165a, and 165b.

Figure 10:
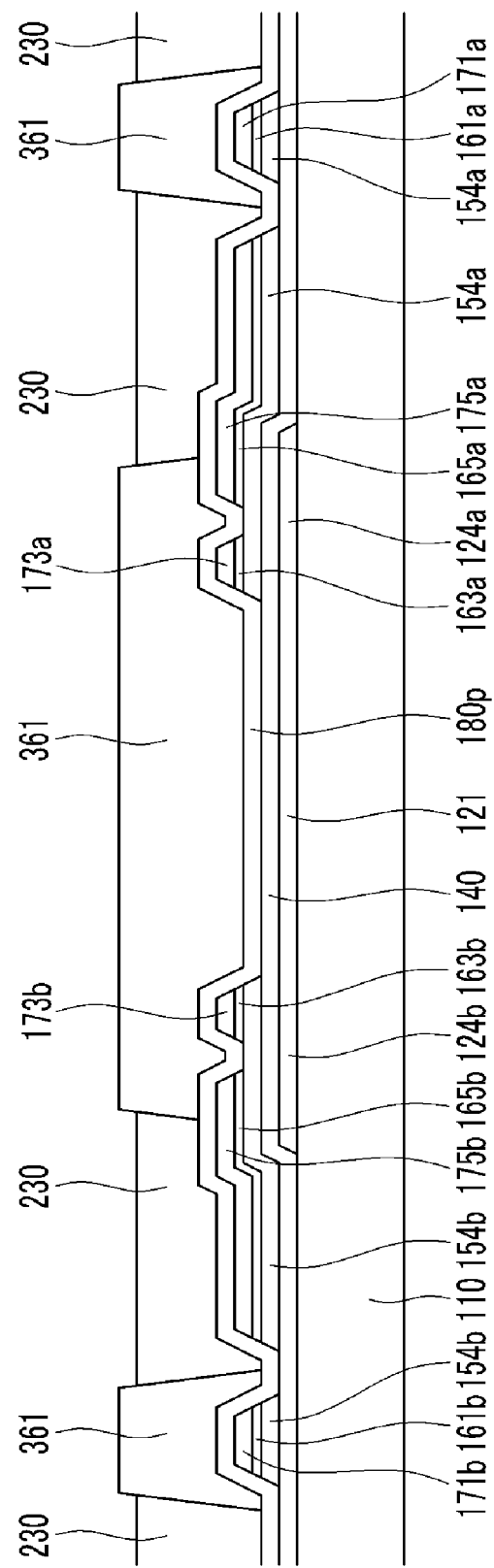

As shown in FIGS. 9 and 10, a lower passivation layer 180p is formed on the data lines 171a and 171b and the drain electrodes 175a and 175b. A black organic material is formed on the lower passivation layer 180p, and is patterned to form a partition 361.

A color filter 230 is formed in a pixel, which is defined by the partition 361. The color filter 230 may be formed by an inkjet printing method, which may include an inkjet head dripping a color filter solvent while being moved, and the color filter solvent is then dried.

The partition 361 in the illustrated embodiments is formed according to the gate line 121 and the data lines 171a and 171b, such that the region where the color filter 230 is filled, substantially forms a quadrangle. The partition 361 is arranged having substantially straight (e.g., linear) portions at a boundary of the partition 361 and the enclosed region defining the pixel. The partition 361 of the illustrated embodiments does not include any protrusions extending into the enclosed region, such that a phenomenon in which the color filter 230 is not sufficiently filled when forming the color filter 230 by the inkjet printing method, may be reduced or effectively prevented.

Figure 11:
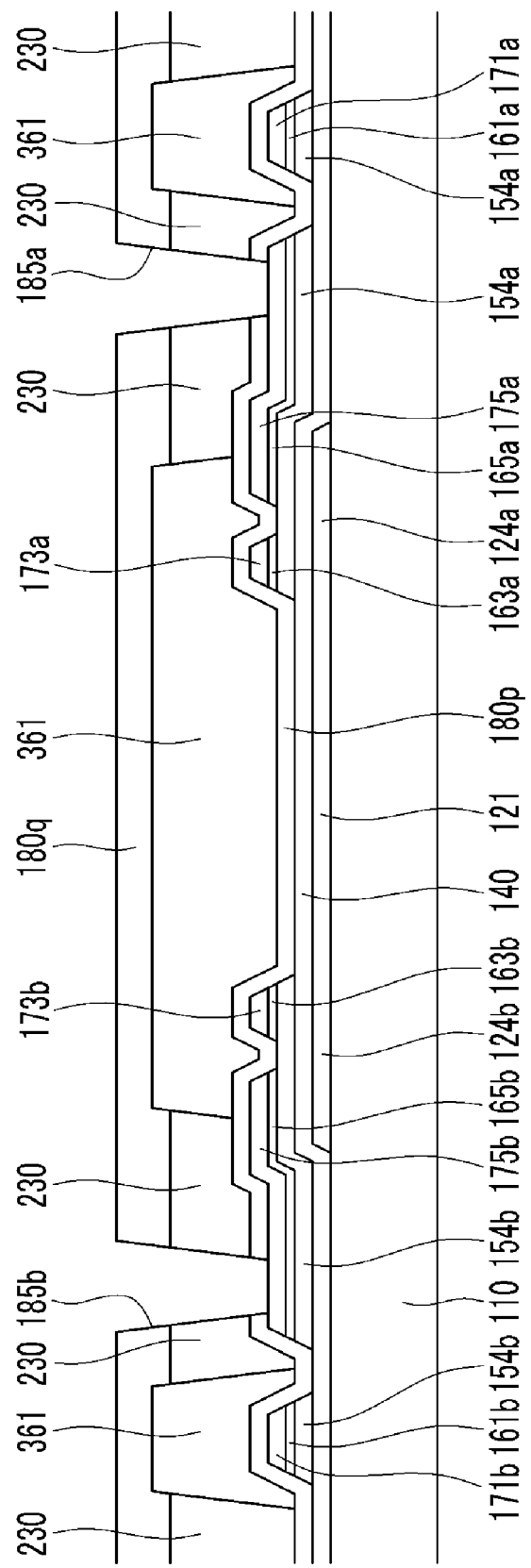

As shown in FIG. 11, an upper passivation layer 180q is formed on the color filter 230 and the partition 361, and is patterned along with the color filter 230 and the lower passivation layer 180p to form contact holes 185a and 185b. When forming the upper passivation layer 180q made of a photosensitive organic material, the upper passivation layer 180q is exposed and developed, and the color filter 230 and the lower passivation layer 180p are dry-etched. The upper passivation layer 180q, the color filter 230, and the lower passivation layer 180p may be etched together such that the inner boundaries of the contact holes 185a and 185b formed in the upper passivation layer 180q, the color filter 230, and the lower passivation layer 180p have substantially the same plane pattern and coincide with each other. The edges of the upper passivation layer 180q, the color filter 230, and the lower passivation layer 180p at the contact holes 185a and 185b, are formed coplanarly with each other, as illustrated in FIG. 11.

The partition 361 is disposed on a portion of the thin film transistor array panel corresponding to the gate line 121 and the data lines 171a and 171b and substantially forms the quadrangle such that the contact holes 185a and 185b may be positioned in a predetermined region of the pixel electrode 191. As shown in FIGS. 6 and 7, even though the position of the contact holes 185a and 185b is changed according to the shape of the pixel electrode 191, it is not necessary to change the shape of the mask for forming the partition 361. Advantageously, a manufacturing process, time, and cost can be reduced.

Returning to FIG. 3, the pixel electrode 191 is formed on the upper passivation layer 180q. An alignment layer 11 may be formed on the pixel electrode 191.

Another exemplary embodiment of a thin film transistor array panel according to the present invention will now be described with reference to FIG. 12 to FIG. 14.

Figure 12:
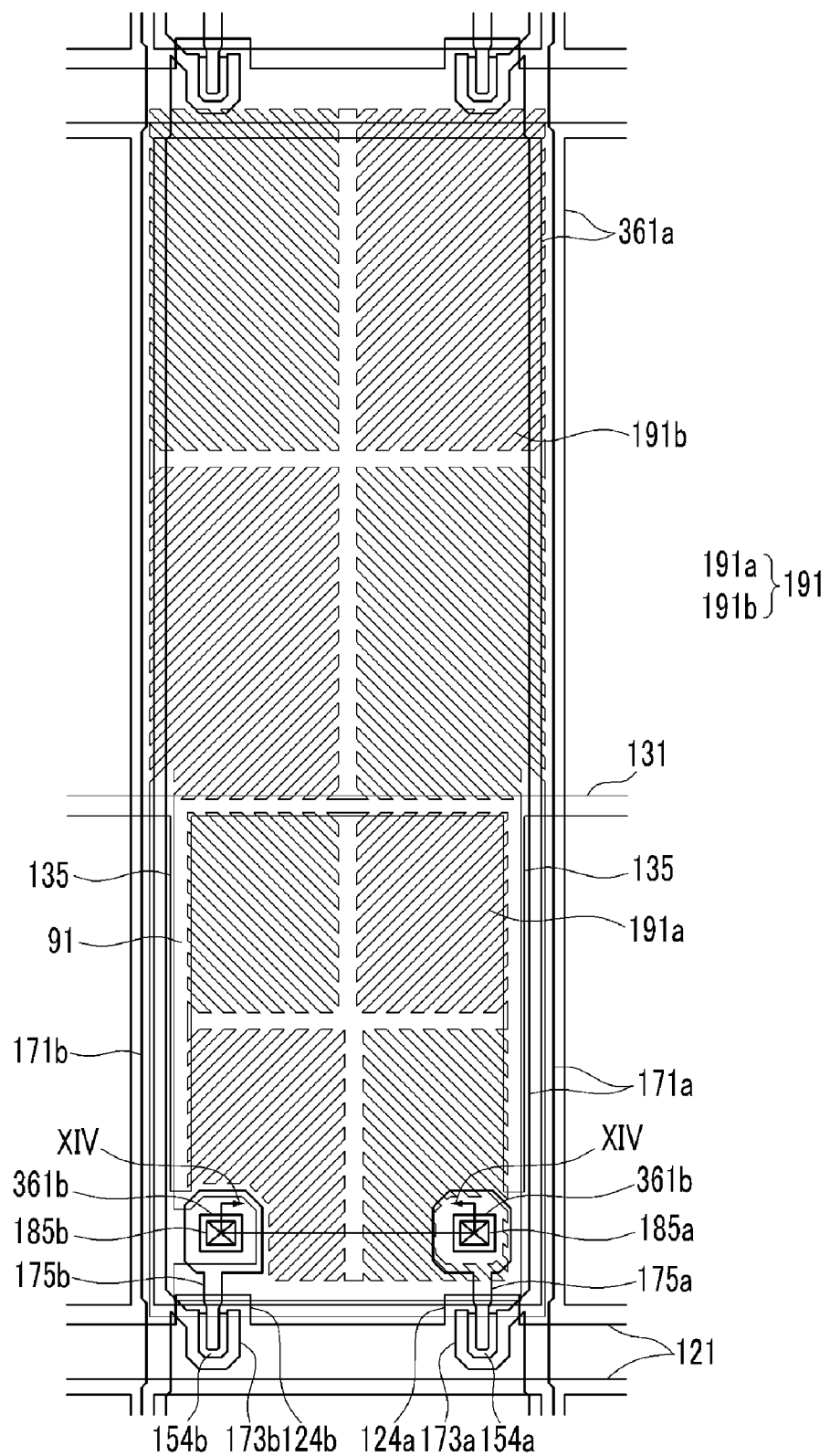
FIG. 12 is a layout view of another exemplary embodiment of a thin film transistor array panel of a liquid crystal display, according to the present invention.
Figure 13:
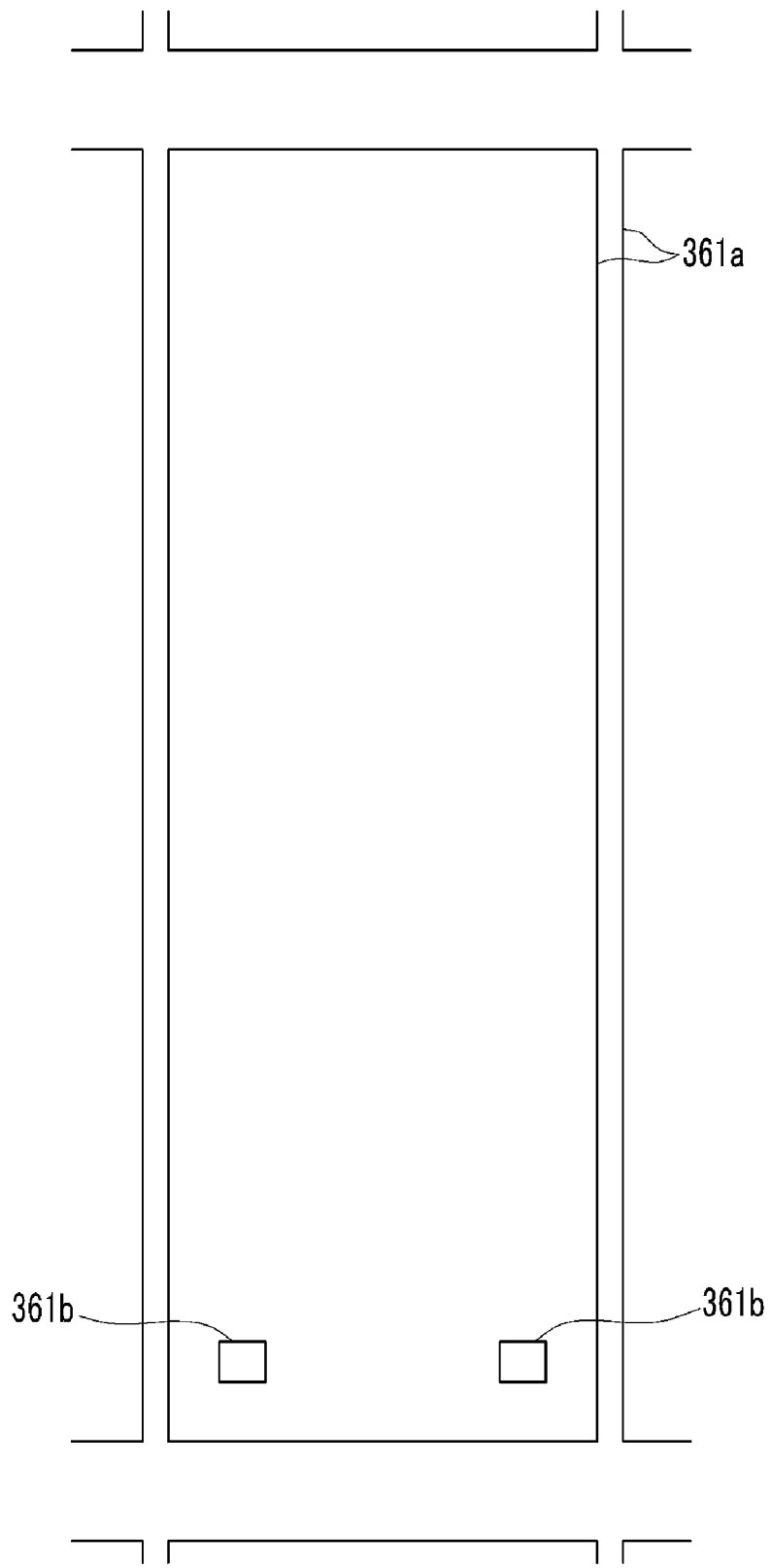
FIG. 13 is a top plan view showing an exemplary embodiment of a partition of the thin film transistor array panel shown in FIG. 12.
Figure 14:
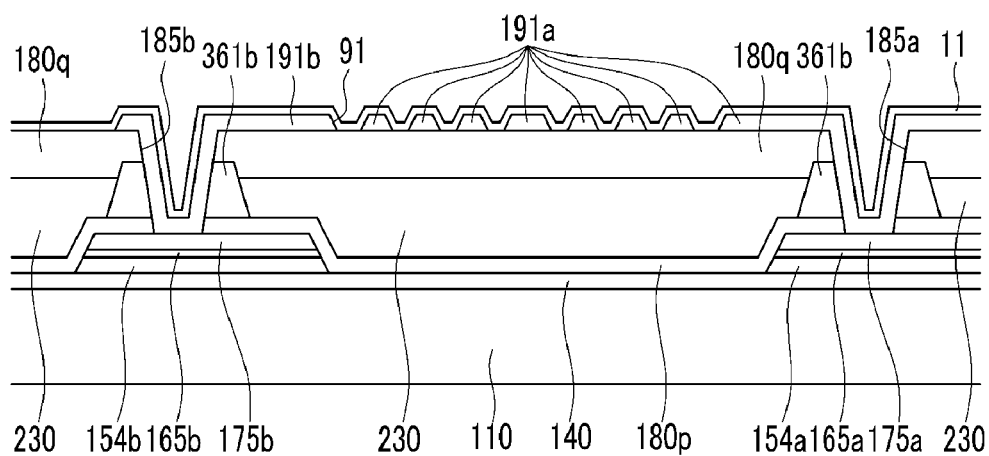
FIG. 14 is a cross-sectional view of the liquid crystal display shown in FIG. 12 taken along line XIV-XIV.

FIG. 12 is a layout view of another exemplary embodiment of a thin film transistor array panel according to the present invention, FIG. 13 is a top plan view showing an exemplary embodiment of a partition of the thin film transistor array panel shown in FIG. 12, and FIG. 14 is a cross-sectional view of the liquid crystal display shown in FIG. 12 taken along line XIV-XIV.

A thin film transistor array panel is substantially the same as the thin film transistor array panel shown in FIG. 2 to FIG. 5 such that descriptions of the same elements will be omitted, and the same constituent elements as in the above-described exemplary embodiment are indicated by the same reference numerals.

Referring to FIG. 12 to FIG. 14, a partition 361 includes a straight portion 361a disposed in the longitudinal direction and corresponding to the gate line 121 and the data lines 171a and 171b, and an expansion portion 361b disposed in the region enclosed by the partition 361, defining a pixel. Contact holes 185a and 185b are disposed overlapping the expansion portion 361b. Also, the contact holes 185a and 185b are extended completely through the upper passivation layer 180q, the expansion portion 361b and the lower passivation layer 180p. The boundaries of the upper passivation layer 180q, the expansion portion 361b, and the lower passivation layer 180p at the contact holes 185a and 185b have a substantially planar profile, and coincide with each other. The degree to which the boundaries of the upper passivation layer 180q, the expansion portion 361b, and the lower passivation layer 180p are aligned, depends on a process error range.

An exemplary embodiment of a manufacturing method of the thin film transistor array panel of FIG. 12 to FIG. 14 will be described with reference to FIGS. 15 and 16.

Figure 15:
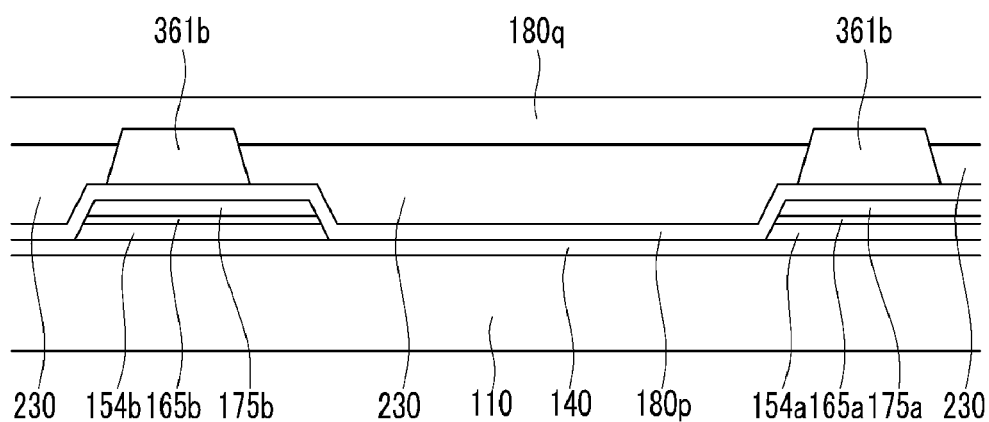
FIGS. 15 and 16 are cross-sectional views sequentially showing an exemplary embodiment of a manufacturing method of the thin film transistor array panel for the liquid crystal display shown in FIGS. 12 and 13.
Figure 16:
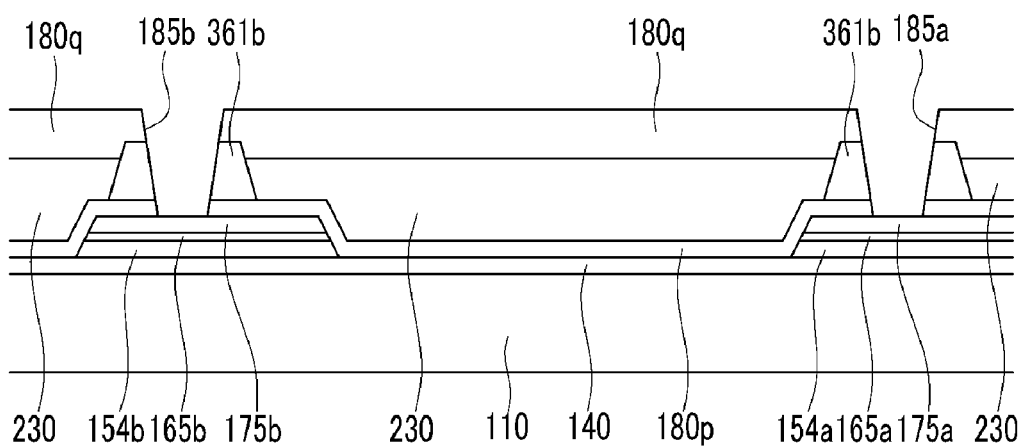

FIGS. 15 and 16 are cross-sectional views sequentially showing the exemplary embodiment of a manufacturing method of the thin film transistor array panel for the liquid crystal display shown in FIG. 12 to FIG. 14.

A gate line 121, a gate insulating layer 140, a semiconductor 154, ohmic contact layers 161a, 161b, 163a, 163b, 165a, and 165b, and data lines 171a, 171b, 173a, 173b, 175a, and 175b are formed on a substrate 110 through the above described methods of FIGS. 8 and 9.

As shown in FIG. 15, a lower passivation layer 180p is formed on the data lines 171a, 171b, 173a, 173b, 175a, and 175b. A partition 361 including a straight portion 361a and an expansion portion 361b is formed directly on the lower passivation layer 180p.

A color filter 230 is formed, such as by an inkjet printing method, and an upper passivation layer 180q is formed on the color filter 230.

As shown in FIG. 16, the passivation layer 180q, the color filter 230, the partition 361, and the lower passivation layer 180p are then etched to form contact holes 185a and 185b.

The boundaries of the upper passivation layer 180q, the expansion portion 361b, and the lower passivation layer 180p defining the contact holes 185a and 185b, are substantially linearly disposed in a same plane.

In an exemplary embodiment of the present invention, the expansion portion 361b is maintained at the position where the contact holes 185a and 185b will be formed, and is removed when forming the contact holes 185a and 185b, thereby further minimizing the area of the expansion portion 361b. In the conventional art, the expansion portion 361b may be formed with a donut shape (e.g., concentric circles), to pre-open the portion where the contact holes 185a and 185b are formed, when forming the expansion portion 361b. In this way, if the portion where the contact holes 185a and 185b will be formed is previously formed, the expansion portion is formed with a larger size than the required size of the contact hole 185a and 185b, since a process margin would need to be considered. As a result, the area of the expansion portion 361b becomes undesirably greater.

However, in an exemplary embodiment of the present invention, the expansion portion 361b is not previously formed and the expansion portion 361b is removed along with (e.g., at substantially the same time as) the upper passivation layer 180q, such that the expansion portion 361b is formed without a difference from the required size of the contact hole 185a and 185b. Advantageously, the area of the expansion portion 361b may be minimized, thereby increasing the aperture ratio.

Also, the area occupied by the expansion portion 361b may be minimized such that the distance between the straight portion 361a and the expansion portion 361b becomes greater than accomplished in the conventional art when forming the pixel electrode with the conventional pattern. Advantageously, the flow of the color filter 230 material between the straight portion 361a and the expansion portion 361b is improved. Accordingly, the color filter 230 may be completely filled, e.g., without an empty space in the filling region.

Also, when forming the color filter 230 by the inkjet process, the color filter 230 may flow on the opened portion where contact holes are disposed. However, if the contact holes 185a and 185b are formed after forming the expansion portion as in an exemplary embodiment of the present invention, the contact holes 185a and 185b are not contaminated by the color filter 230 when the color filter 230 is applied.

As shown in FIG. 14, a pixel electrode 191 connected to the drain electrode 175a and 175b through the contact holes 185a and 185b is formed, and an alignment layer 11 is formed on the pixel electrode 191.

Another exemplary embodiment of a thin film transistor array panel for a liquid crystal display according to the present invention will be described with reference to FIG. 17.

Figure 17:
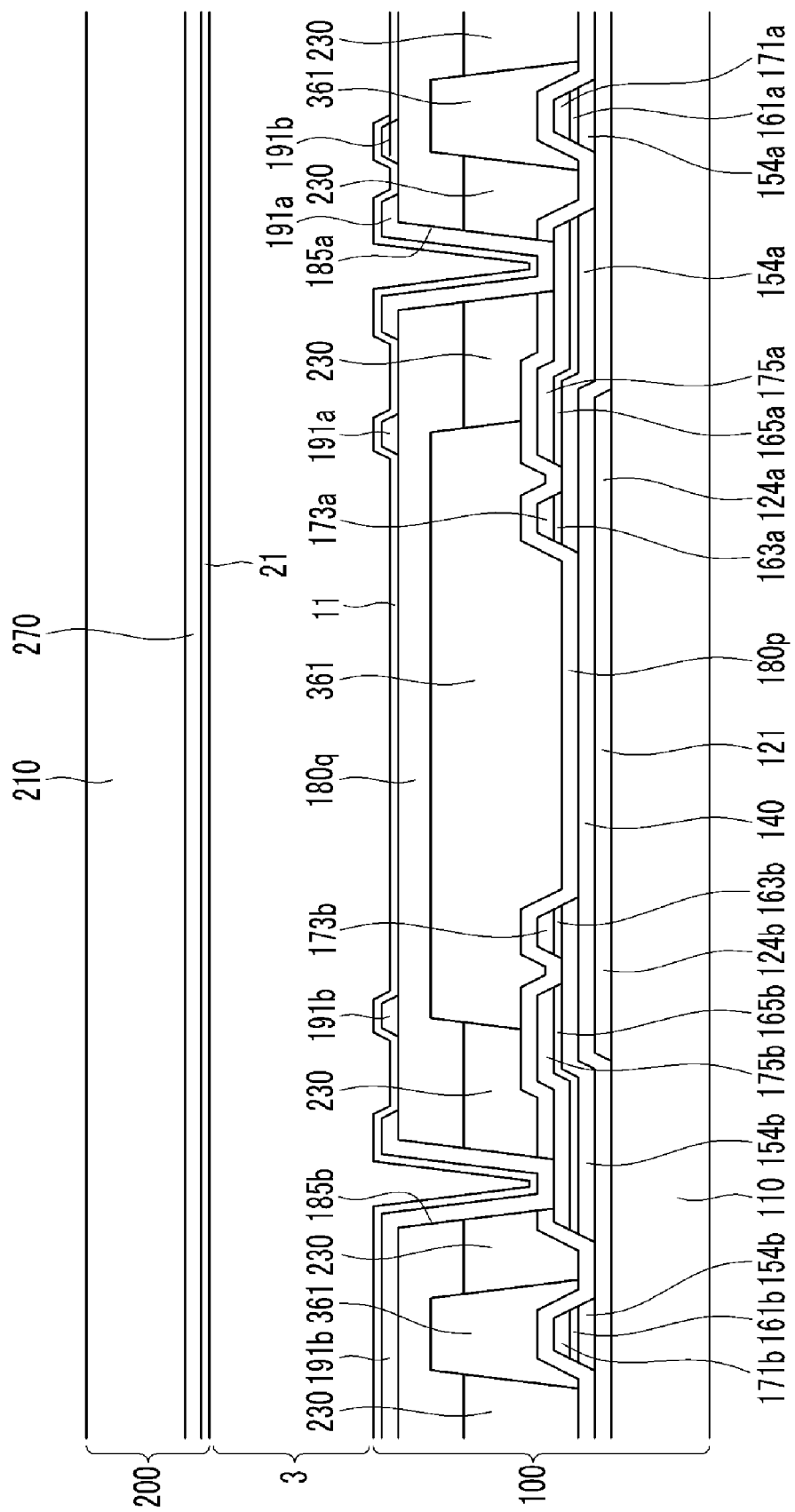
FIG. 17 is a cross-sectional view of the thin film transistor array panel for the liquid crystal display shown in FIGS. 2 and 3 taken along the line III-III.

FIG. 17 is a cross-sectional view of another exemplary embodiment of the thin film transistor array panel of the liquid crystal display shown in FIGS. 2 and 3 taken along line III-III.

A thin film transistor array panel of the illustrated embodiment is substantially the as the thin film transistor array panel shown in FIG. 2 to FIG. 3 such that descriptions of the same elements will be omitted, and the same constituent elements as in the above-described exemplary embodiment are indicated by the same reference numerals.

Referring to FIG. 17, the partition 361 is thicker in a direction perpendicular to the insulating substrate 110, than the partition 361 of the thin film transistor array panel shown in FIGS. 3 and 14. In an exemplary embodiment, it is preferable that the thickness of the partition 361 is more than 2 micrometers (μm).

When a thickness of the color filter 230 and the partition 361 are both about 1.5-1.7 μm, and the differences between the thicknesses of the color filter 230 and the partition 361 are relatively small, the partition 361 must be formed with more than a predetermined width to prevent the color filter 230 from being overflowed into the neighboring pixel when forming the color filter 230 by the inkjet printing method. However, if the partition 361 is formed with a thickness of more than 2 μm as in an exemplary embodiment of the present invention, the thickness difference between the partition 361 and the color filter 230 may be more than 0.3 μm, and overflow of the color filter 230 into the neighboring pixel may be reduced or effectively prevented, even though the partition 361 does not have a relative wide width (e.g., taken parallel to the insulating substrate 110.). Advantageously, the width of the partition 361 may be reduced, thereby increasing the aperture ratio of the pixel.

While this invention has been described in connection with exemplary embodiments, it is to be understood that the invention is not limited to the illustrated embodiments, but, on the contrary, is intended to cover various modifications and equivalent arrangements included within the spirit and scope of the appended claims.

What is claimed is:

1. A thin film transistor array panel comprising:
    an insulating substrate;
    a gate line and a data line disposed on the insulating substrate, insulated from and intersecting each other;
    a thin film transistor connected to the gate line and the data line;
    a partition disposed corresponding to the gate line and the data line, and defining a color filter filling region;
    a color filter disposed in the filling region;
    a passivation layer disposed on the color filter and the partition; and
    a pixel electrode disposed on the passivation layer and connected to the thin film transistor through a contact hole disposed through the passivation layer and the color filter,
    wherein a plane shape of the color filter filling region is substantially a rectangle.

2. The thin film transistor array panel of claim 1, wherein boundaries of the passivation layer and the color filter adjacent to the contact hole are disposed substantially coplanarly.

3. The thin film transistor array panel of claim 1, wherein the contact hole is disposed at a position in the filling region.

4. The thin film transistor array panel of claim 1, wherein a thickness of the partition and the color filter is more than approximately 0.3 micrometer (μm), the thickness taken substantially perpendicular to the insulating substrate.

5. The thin film transistor array panel of claim 1, wherein the partition includes a black pigment.

6. The thin film transistor array panel of claim 1, wherein the passivation layer includes a photosensitive organic material.

7. The thin film transistor array panel of claim 1, wherein the partition includes an expansion portion disposed in the filling region, and
    the contact hole is disposed coinciding with the expansion portion.

8. The thin film transistor array panel of claim 7, wherein:
    boundaries of the passivation layer and the expansion portion defining the contact hole are disposed substantially coplanarly.

* * * * *